United States Patent
Sunder et al.

(10) Patent No.: US 9,747,397 B2
(45) Date of Patent: Aug. 29, 2017

(54) MULTI-MODE MULTI-CORNER CLOCKTREE SYNTHESIS

(71) Applicant: Mentor Graphics Corporation, Wilsonville, OR (US)

(72) Inventors: Sivaprakasam Sunder, Cupertino, CA (US); Kirk Schlotman, Plano, TX (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 15/076,991

(22) Filed: Mar. 22, 2016

(65) Prior Publication Data

US 2016/0203251 A1 Jul. 14, 2016

Related U.S. Application Data

(63) Continuation of application No. 13/274,276, filed on Oct. 14, 2011, now Pat. No. 9,310,831, which is a
(Continued)

(51) Int. Cl.
*G06F 17/50* (2006.01)
*G06F 1/10* (2006.01)
(Continued)

(52) U.S. Cl.
CPC ............ *G06F 17/5045* (2013.01); *G06F 1/10* (2013.01); *G06F 3/0482* (2013.01);
(Continued)

(58) Field of Classification Search
USPC ......................................................... 716/113
See application file for complete search history.

(56) References Cited

U.S. PATENT DOCUMENTS

| | | | |
|---|---|---|---|
| 5,617,426 A | 4/1997 | Koenemann et al. | |
| 6,204,713 B1 | 3/2001 | Adams et al. | |

(Continued)

OTHER PUBLICATIONS

International Search Report and Written Opinion dated Apr. 13, 2009 from International Patent Application No. PCT/US2009/034583, 8 pp.

(Continued)

*Primary Examiner* — Mohammed Alam
(74) *Attorney, Agent, or Firm* — Klarquist Sparkman, LLP

(57) ABSTRACT

In one embodiment, a method for building a clock tree for an integrated circuit design is provided. The clock tree may include a clock tree root node and a plurality of clock tree nodes that couple to sink pins for circuit elements of the integrated circuit design. The clock tree nodes may be arranged to distribute the clock signal to the sink pins. In synthesizing the clock tree, the sink pins may be clustered into one or more clusters. Clock tree nodes may be placed for the clock tree to distribute the clock signal to the one or more clusters. Timing information is determined to measure the clock signal delay from the root to the sink pins in the one or more clusters based on the placed one or more clock tree nodes. Different sets of timing information may be determined based on different sets of clock tree timing variation parameters. For example, the clock tree timing variation parameters includes timing information for multiple process corners and/or multiple modes of operation.

9 Claims, 6 Drawing Sheets

Related U.S. Application Data continuation-in-part of application No. 12/036,191, filed on Feb. 22, 2008, now abandoned, and a continuation-in-part of application No. 12/026,755, filed on Feb. 6, 2008, now abandoned.

(51) Int. Cl.
*G06F 3/0482* (2013.01)
*G06F 3/0484* (2013.01)
*G06T 11/20* (2006.01)

(52) U.S. Cl.
CPC ...... *G06F 3/04842* (2013.01); *G06F 3/04847* (2013.01); *G06F 17/5031* (2013.01); *G06F 17/5072* (2013.01); *G06F 17/5081* (2013.01); *G06T 11/206* (2013.01); *G06F 2217/62* (2013.01); *G06T 2200/24* (2013.01)

(56) References Cited

U.S. PATENT DOCUMENTS

| | | |
|---|---|---|
| 6,298,468 B1 | 10/2001 | Zhen |
| 6,407,756 B1 | 6/2002 | Sontag et al. |
| 6,460,166 B1 | 10/2002 | Reddy et al. |
| 6,530,065 B1 | 3/2003 | McDonald et al. |
| 6,782,519 B2 | 8/2004 | Chang et al. |
| 6,836,877 B1 | 12/2004 | Dupenloup |
| 6,904,572 B2 | 6/2005 | Igarashi |
| 6,909,311 B2 | 6/2005 | Foley et al. |
| 6,944,840 B2 | 9/2005 | Sasaki et al. |
| 7,020,854 B2 | 3/2006 | Killian et al. |
| 7,039,891 B2 | 5/2006 | Tetelbaum |
| 7,042,269 B2 | 5/2006 | Kao |
| 7,051,310 B2 | 5/2006 | Tsao |
| 7,191,417 B1 | 3/2007 | Luo et al. |
| 7,216,322 B2 | 5/2007 | Lai et al. |
| 7,225,421 B2 | 5/2007 | Migatz et al. |
| 7,275,235 B2 | 9/2007 | Molinari et al. |
| 7,299,433 B2 | 11/2007 | Clement et al. |
| 7,334,209 B1 | 2/2008 | Roberts et al. |
| 7,406,672 B1 | 7/2008 | Fukuda |
| 7,418,689 B2 | 8/2008 | Habitz et al. |
| 7,479,825 B2 | 1/2009 | Komoda |
| 7,486,130 B2 | 2/2009 | Overs |
| 7,512,923 B2 | 3/2009 | Tsuchiya |
| 7,519,927 B1 | 4/2009 | Hryckowian et al. |
| 7,523,430 B1 | 4/2009 | Patel |
| 7,526,666 B1 | 4/2009 | Soni |
| 7,555,740 B2 | 6/2009 | Buck et al. |
| 7,584,443 B1 | 9/2009 | Govig et al. |
| 7,624,364 B2 | 11/2009 | Albrecht et al. |
| 7,689,957 B2 | 3/2010 | Shenoy |
| 7,810,061 B2 | 10/2010 | Minonne et al. |
| 7,930,652 B2 | 4/2011 | Wood |
| 7,996,804 B2 | 8/2011 | Nikitin et al. |
| 2002/0045995 A1 | 4/2002 | Shimazaki et al. |
| 2003/0048122 A1 | 3/2003 | Kazi |
| 2003/0058280 A1 | 3/2003 | Molinari et al. |
| 2003/0135836 A1 | 7/2003 | Chang et al. |
| 2003/0167451 A1 | 9/2003 | Igarashi |
| 2004/0225984 A1 | 11/2004 | Tsao |
| 2005/0050497 A1 | 3/2005 | Tetelbaum |
| 2006/0053395 A1 | 3/2006 | Lai et al. |
| 2006/0064658 A1 | 3/2006 | Minonne et al. |
| 2006/0132186 A1 | 6/2006 | Bourgin |
| 2006/0190899 A1 | 8/2006 | Migatz et al. |
| 2006/0248488 A1* | 11/2006 | Habitz ............... G06F 17/5077 716/126 |
| 2007/0094627 A1 | 4/2007 | Komoda |
| 2007/0106970 A1 | 5/2007 | Fukuda |
| 2007/0136708 A1 | 6/2007 | Overs et al. |
| 2007/0171733 A1 | 7/2007 | Wood |
| 2007/0220465 A1 | 9/2007 | Tsuchiya |
| 2007/0288875 A1 | 12/2007 | Eakins et al. |
| 2008/0168412 A1* | 7/2008 | Cheon ............... G06F 17/5077 716/114 |
| 2009/0064067 A1 | 3/2009 | Liu et al. |
| 2009/0070714 A1* | 3/2009 | Shenoy ............... G06F 17/5031 716/132 |
| 2009/0179680 A1 | 7/2009 | Reuland et al. |
| 2009/0187873 A1 | 7/2009 | Nikitin et al. |
| 2009/0199143 A1 | 8/2009 | Sclotman et al. |
| 2009/0217225 A1 | 8/2009 | Sunder et al. |
| 2009/0254874 A1 | 10/2009 | Bose |
| 2010/0049481 A1 | 2/2010 | Walker et al. |
| 2012/0110538 A1* | 5/2012 | Shih ............... G06F 17/5077 716/129 |
| 2012/0240091 A1 | 9/2012 | Sunder et al. |

OTHER PUBLICATIONS

International Search Report and Written Opinion dated Mar. 13, 2009 from International Patent Application No. PCT/US2009/033203, 6 pp.

* cited by examiner

MULTI-MODE MULTI-CORNER CLOCKTREE SYNTHESIS

CROSS REFERENCE TO RELATED APPLICATION

This application is a continuation of U.S. patent application Ser. No. 13/274,276, filed Oct. 14, 2011 and entitled "MULTI-MODE MULTI-CORNER CLOCKTREE SYNTHESIS", which is a continuation-in-part of U.S. patent application Ser. No. 12/036,191, filed Feb. 22, 2008 and entitled "MULTI-MODE MULTI-CORNER CLOCKTREE SYNTHESIS," and which is also a continuation-in-part of U.S. patent application Ser. No. 12/026,755 filed on Feb. 6, 2008, and entitled "CLOCK TREE SYNTHESIS GRAPHICAL USER INTERFACE", all of which are hereby incorporated by reference herein in their entirety.

BACKGROUND

Particular embodiments generally relate to electronic design automation (EDA) tools and more specifically to clock tree synthesis. A clock tree distributes a clock signal from a source node to a set of sink nodes within an integrated circuit design. The clock tree may include a number of levels of clock tree repeaters that fan the clock signal out to different sink pins. The primary objective in clock tree design is to ensure that the clock signal arrives at all of the sink pins at the same time. The skew in a clock tree is the maximum difference in the arrival time of the clock signal at the sink pins. A clock tree synthesis (CTS) tool is used to generate a clock tree with good clock skew.

SUMMARY

Particular embodiments generally relate to clock tree synthesis considering multiple timing variation parameters (corners and modes). In one embodiment, a method for building a clock tree for an integrated circuit design is provided. The clock tree may include a clock tree root node and a plurality of clock tree nodes that couple to sink pins for circuit elements of the integrated circuit design. The clock tree nodes may be arranged to distribute the clock signal to the sink pins. In synthesizing the clock tree, the sink pins may be clustered into one or more clusters. Clock tree nodes may be placed for the clock tree to distribute the clock signal to the one or more clusters. Timing information is determined to measure the clock signal delay from the root to the sink pins in the one or more clusters based on the placement of clock tree nodes. Different sets of timing information may be determined based on different sets of clock tree timing variation parameters.

A plurality of CTS metric values are measured for the one or more clusters. For example, the clock skew values are measured for different sets of timing information for the different sets of clock tree timing variation parameters. The clock tree is then optimized based on the clock skew values measured for the different sets of timing information. For example, the placement of the clock tree nodes or the sink pins included in the one or more clusters may be adjusted and new clock skew values are determined for different clock tree timing variation parameters. Particular embodiments balance whether clock skew is improved across the clock tree timing variation parameters. For example, the process makes sure that if clock skew is improved for one timing scenario clock skew is not significantly worsened for another timing scenario (a timing scenario includes a mode and corner). The clock tree may be adjusted to optimize the clock skew. This process continues as clock tree nodes are placed in the design to generate the clock tree.

A further understanding of the nature and the advantages of particular embodiments disclosed herein may be realized by reference of the remaining portions of the specification and the attached drawings.

DETAILED DESCRIPTION OF EMBODIMENTS

Figure 1:
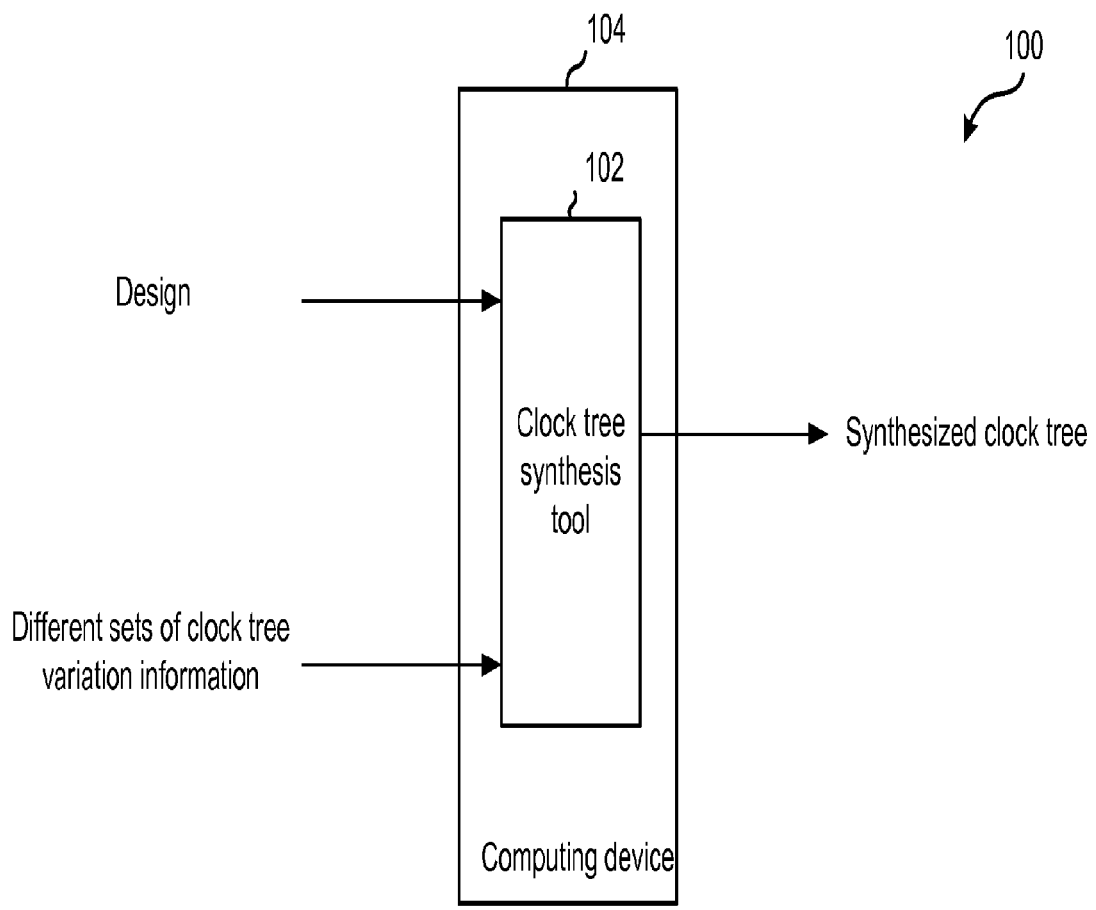
FIG. 1 depicts an example of a system for performing clock tree synthesis according to one embodiment.

FIG. 1 depicts an example of a system 100 for performing clock tree synthesis according to one embodiment. A clock tree synthesis (CTS) tool 102 is provided. Although one instance of CTS tool 102 is shown, it will be understood that many instances may be provided and may perform processing in parallel.

CTS tool 102 may be found on a computing device 104, such as a personal computer, laptop computer, workstation, or other computing device. In one embodiment, CTS tool 102 may include software stored on a computer-readable storage media that may be read and executed by one or more processors of the computing device to perform clock tree synthesis.

CTS tool 102 receives a design, such as an integrated circuit (IC) design, and can perform clock tree synthesis for the design. Clock tree synthesis includes building a clock tree to distribute a clock signal to sink pins of devices in the IC design. In building the clock tree, CTS 102 may use timing information for different sets of clock tree timing variation parameters. The variation parameters may be different parameters for multiple process corners and/or multiple modes of operation. Using these parameters, different sets of timing information may be determined and used to build an optimal clock tree.

A corner may be conditions for voltage, temperature, or other manufacturing parameters. The corner may model process variations that may occur during manufacturing of the integrated circuit design. The corner may also model variations in operating environment for the circuit that manifests itself as different voltage and temperature conditions. In one example, a number of process corners may be provided, such as 9 different process corners. Depending on the corner, timing delays may differ.

A mode of operation may be different modes that the integrated circuit design may operate in. For example, each mode may operate differently and cause different timing information to be determined. For example, the modes may include a test mode, functional mode, stand-by mode, powered on mode, etc. These are different modes in which a client may cause the integrated circuit design to operate. For example, a computer that is using a chip including the IC design may be in a stand-by mode and the circuit operates in the stand-by mode. Depending on the mode, timing delays may differ.

CTS tool 102 may take into account different sets of clock tree timing variation parameters in determining the placement of clock tree nodes in a clock tree. In one embodiment, clock tree nodes may be buffers or inverters. Clock tree nodes may also be other logic elements that can be used to fan out a clock signal.

CTS tool 102 may place clock tree nodes for sink pins of devices to be clocked. For example, CTS tool 102 synthesizes a clock tree for delivering a clock signal to a number of clocked devices, such as registers, latches, flip-flops, etc., that are clocked by the same clock signal. Each of the clocked devices may include sink pins in which clock tree nodes are connected. A hierarchy of clock tree nodes may be provided to fan the clock signal out from a root node to the sink pins.

CTS tool 102 determines the placement and fan-out of the clock tree nodes during clock tree synthesis. In determining the placement and fan-out a CTS metric is optimized based on different sets of clock tree timing variation parameters. A CTS metric may be a metric that can be altered or varied when a clock tree is being synthesized based on timing information. For example, clock skew is discussed as being optimized. Also, other CTS metrics are also optimized, such as area, power, insertion delays, etc.

The different sets of variation parameters yield different timing information for the clock tree. In one example, when optimizing clock skew using one corner, how the clock skew is affected for other corners is also analyzed. Thus, if the clock tree is adjusted to improve skew for one corner, CTS tool 102 balances whether clock skew for another corner is significantly worsened. This is an iterative process in which balancing clock skew for multiple corners may be performed in synthesizing the clock tree. The timing information for all corners and modes is considered simultaneously or concurrently. For example, multiple iterative runs may not be run where one corner or mode is considered, and then another mode or corner is considered. Rather, timing information for all corners and modes are considered simultaneously. Accordingly, multi-corner process information and/or multi-mode process information allow synthesis of a clock tree that balances the clock tree synthesis over multi-corners or multi-modes.

A clock tree synthesis conventionally generated the clock tree using one corner or one mode. For example, the clock skew may be optimized based on conditions for one corner. Also, one mode of operation for the circuit may also be taken into account when optimizing the clock tree. Due to different variations in processing the integrated circuit, optimizing based on one corner may not be optimal if different conditions result during processing. Also, circuits are configured to operate in different modes and only taking into account one mode may not result in an optimal clock tree.

Figure 2:
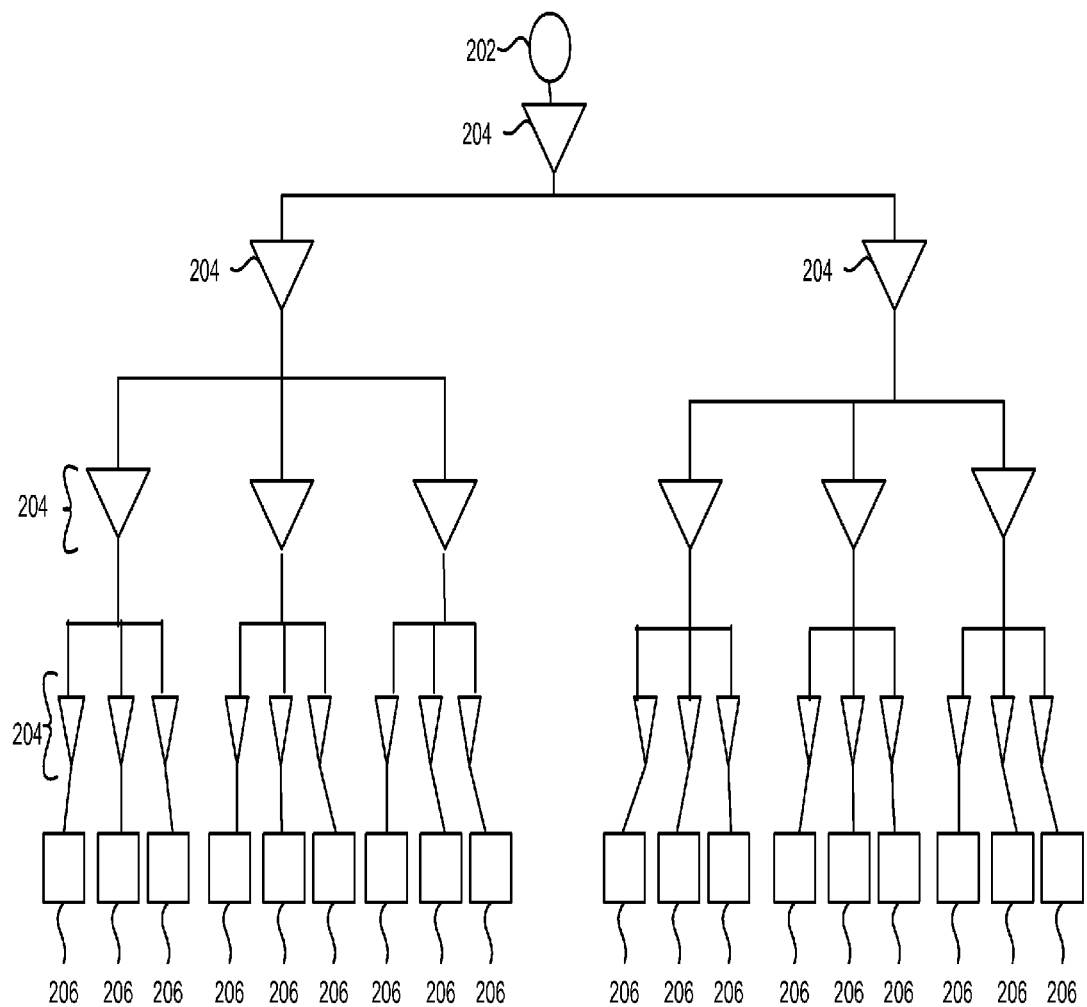
FIG. 2 depicts an example of a clock tree according to one embodiment.

FIG. 2 depicts an example of a clock tree 200 according to one embodiment. As shown, a root node 202 is the root of the clock signal. Various clock tree nodes 204 may be placed in the design to synthesize the clock tree. Different levels of clock tree nodes 204 may be placed to fan out the clock tree signal. The lowest layer of the clock tree may connect to sink pins 206 of clocked devices (not shown). CTS tool 102 synthesizes clock tree after a placement and routing tool has generated a layout for the integrated circuit. The layout places cells for the devices including all of the sink pins. CTS tool 102 then determines where to place clock tree nodes 204 in the design. Clock tree nodes 204 are placed such that clock tree 200 may be balanced in the design. That is, the distance between root node 202 and pins 206 may be somewhat uniform. This may minimize the variation in clock skew. The clock skew may be the difference in time in which a clock signal is received at two different sink pins 206. CTS tool 102 may adjust placement of clock tree nodes 204 in clock tree 202 to minimize clock skew.

Figure 3:
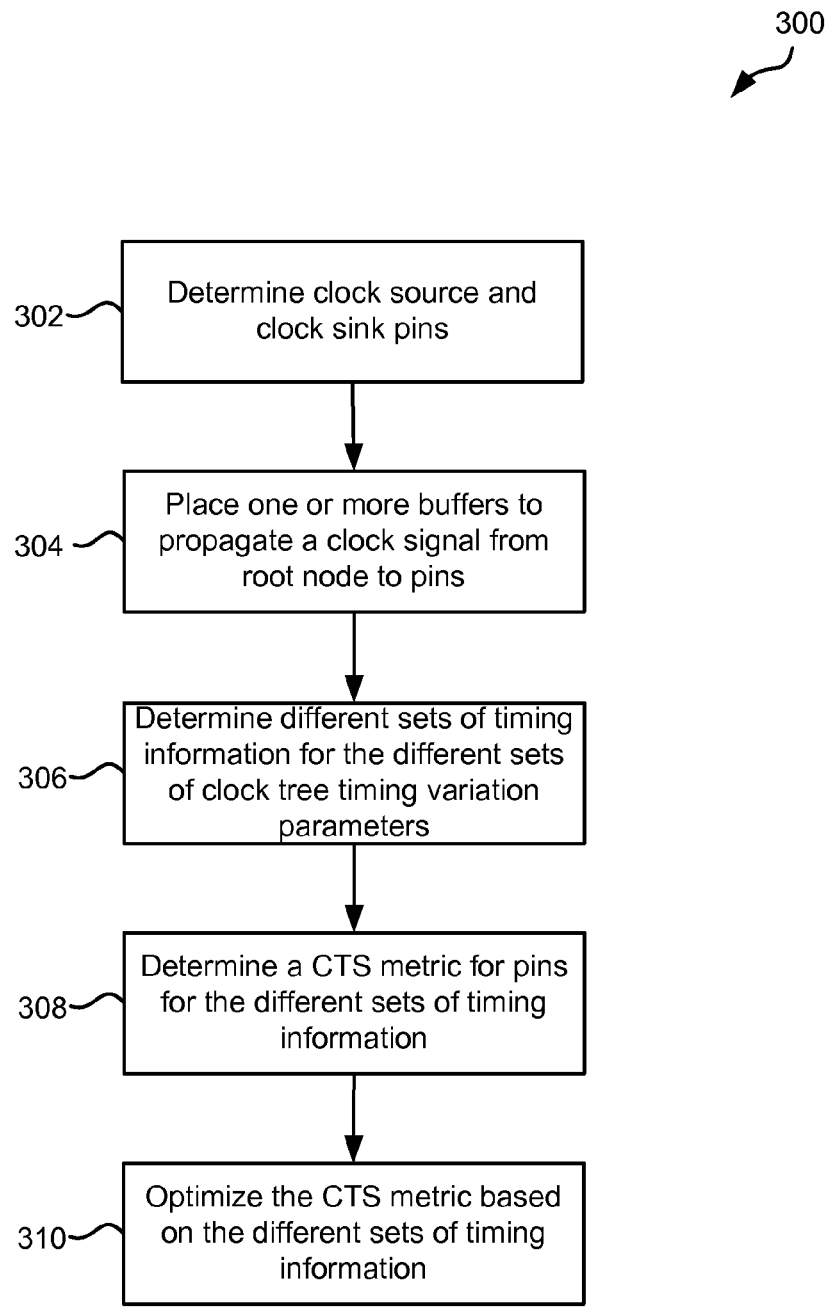
FIG. 3 depicts a simplified flowchart of a method for performing clock tree synthesis using different sets of clock tree timing variation parameters according to one embodiment.

FIG. 3 depicts a simplified flowchart 300 of a method for performing clock tree synthesis using different sets of clock tree timing variation parameters according to one embodiment. In step 302, CTS tool 102 determines the clock source and clock sink pins 206 that will be clocked.

In step 304, CTS tool 102 places one or more clock tree nodes 204 to propagate a clock signal from root node 202 to pins 206. In one example, a bottom-up approach may be used where positions of clock tree nodes for lower levels of the hierarchy are determined first and then positions for clock tree nodes at higher levels are then determined until the root node is reached. Although a bottom-up approach is described, a top-down approach may also be used. In the top-down approach, CTS tool 102 may place higher levels of clock tree nodes first and then position lower levels thereafter.

In step 306, CTS tool 102 determines different sets of timing information for the different sets of clock tree timing variation parameters. For example, timing information from root node 202 to pins 206 is determined for multiple modes and/or multiple corners based on the placement of clock tree nodes 204.

In step 308, a CTS metric for pins 206 is determined for the different sets of timing information. For example, clock skew may be different depending on the corner that is used. Also, depending on the mode, different clock skew may result. Accordingly, CTS tool 102 determines clock skew based on multiple factors that may result in different timing information.

In step 310, CTS tool 102 optimizes the CTS metric based on the different sets of timing information. The optimization may take into account the different sets of timing information simultaneously. For example, it is determined if the placement of nodes is considered optimal considered the sets of timing information. One set of timing information for a corner is not considered and then another set in series. Rather, the sets are considered together.

The placement of the nodes may be adjusted many times. This may be an iterative process where placement of the clock tree nodes may be adjusted and/or pins 206 in clusters may be adjusted. Other adjustments may also be appreciated. This process will be described in more detail below. Generally, synthesis of clock tree 200 may be iteratively adjusted to determine if the CTS metric is improved. For example, the placement of clock tree node 206 may be changed and clock skew may be measured using the different sets of clock tree timing variation parameters. If clock skew is improved for one corner but worsens clock skew in another corner, then the adjustment may not be beneficial. However, if it is determined that clock skew improves for one corner and does not worsen it for other corners, then the adjustment may be positive. A balancing is performed to improve clock skew over multiple corners and/or modes.

Figure 4:
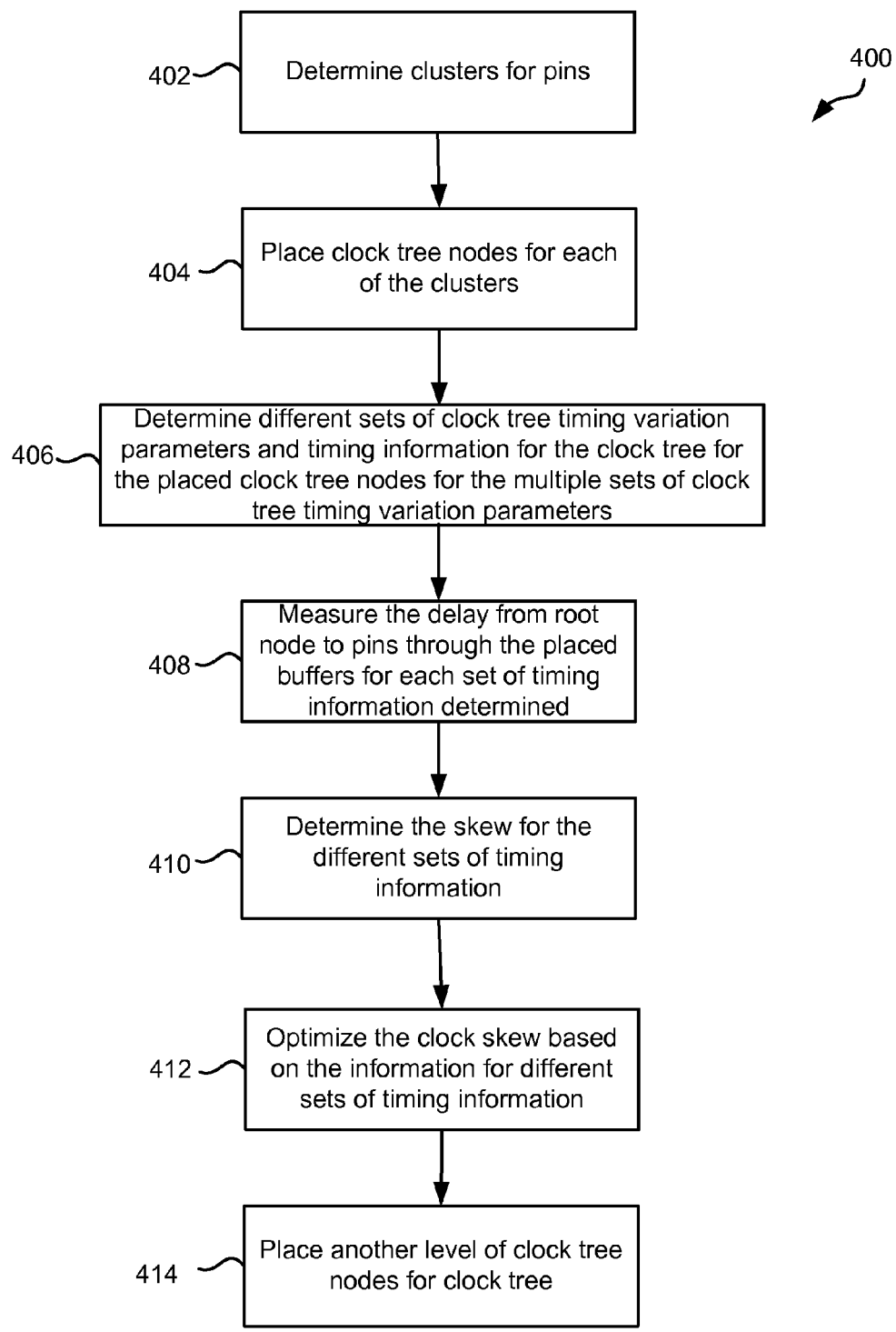
FIG. 4 depicts a simplified flowchart of a method for synthesizing a clock tree 200 according to one embodiment.

The process for synthesizing the clock tree will be described in more detail now. The process described uses a bottom-up approach. Although this approach is described, it will be understood that other approaches may be used, such as a top-down approach. FIG. 4 depicts a simplified flowchart 400 of a method for synthesizing a clock tree 200 according to one embodiment. In step 402, CTS tool 102 determines clusters for pins 206. For example, CTS tool 102 determines groups of pins that should be clustered together. Although a group of pins is described, it will be understood that a group may also include just one pin. The clustering may be an iterative process that changes based on the timing information determined. In one embodiment, pins are clustered together that are considered geometrically close to each other. That is, devices that include pins that may be considered close to each other in the layout may be determined. Other metrics may also be used to determine how to cluster pins 206.

Figure 5:
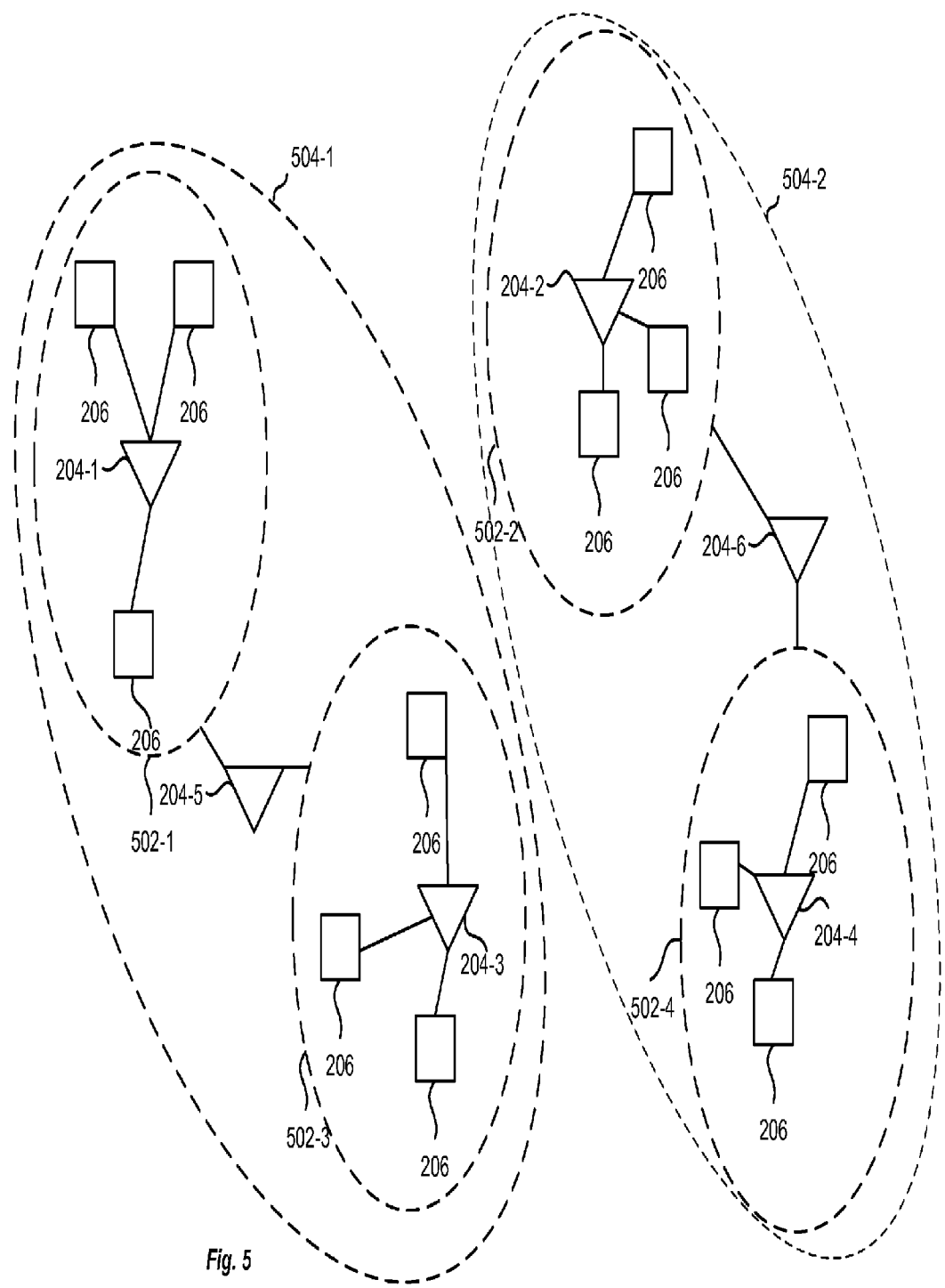
FIG. 5 depicts an example of the clustering and placement of pins according to one embodiment.

In step 404, CTS tool 102 places clock tree nodes for each of the clusters. In one example, clock tree nodes 204 may be placed in substantially the middle of the clusters of pins 206. Also, other positions may be appreciated. FIG. 5 depicts an example of the clustering and placement of pins according to one embodiment. As shown, four clusters 502 have been determined for pins. Also, a clock tree node 204 has been placed in substantially the center of clusters 502 and is connected to pins 206.

A first level of clock tree nodes 204-1-204-4 is placed in clusters 502-2-502-4. These nodes may be placed such that the length from nodes 204 to pins 206 in a cluster is substantially uniform.

Referring back to FIG. 4, in step 406, CTS tool 102 determines different sets of clock tree timing variation parameters and timing information for the clock tree 200 for the placed clock tree nodes 204 for the multiple sets of clock tree timing variation parameters. For example, parameters for a plurality of process corners and/or modes of operation may be determined. In one example, the set of clock tree timing variation parameters may be used to obtain timing information for multiple corners. The timing information may be obtained using techniques described in U.S. Pat. No. 6,909,311, entitled "Methods and Apparatus for Synthesizing a Clock Signal," filed Apr. 3, 2003 and/or U.S. Pat. No. 5,617,426, entitled "Clocking Mechanism for Delay, Short Path and Stuck at Testing," filed Feb. 21, 1995, both of which are incorporated by reference in their entirety for our purposes.

In step 408, CTS tool 102 measures the delay from root node 202 to pins 206 through the placed clock tree nodes 204 for each set of timing information determined. The delay may be measured using the timing information that is determined for multiple corners or modes of operation. The delays in all the corner and modes are computed together and used together to make decisions involving placement or fan-out of the nodes.

In step 410, the skew for the different sets of timing information is determined. For example, the maximum and minimum clock skew may be determined for clusters 502. This may be the largest clock skew and the smallest clock skew. Accordingly, CTS tool 102 determines the maximum clock skew for multiple corners and/or multiple modes. For example, the maximum clock skew may be determined for each corner or mode or the maximum clock skew is determined taking all of the corners and/or modes into account. The clock skew information may vary depending on the corner or mode used. For example, different variations in the processing that each corner includes may cause different timing information to be determined. Thus, clock skew may differ for different corners.

In step 412, when clock skew for all corners has been determined, CTS tool 102 optimizes the clock skew based on the information for different sets of timing information.

The optimization, which is described in more detail below, may alter the synthesis of the clock tree to optimize the clock skew. For example, pins in clusters 502 may be moved to other clusters 502 or a new cluster may be created. Also, placement of clock tree nodes 204 may be moved. When these adjustments are made to the clock tree, the clock skew is again measured across different sets of clock tree timing variation parameters. Thus, for example, it can be determined if the adjustment improves clock skew in one corner, but may worsen clock skew in another corner. This is an iterative process that can be performed to balance an improvement in clock skew across different sets of clock tree timing variation parameters.

In step 414, when skew has been optimized, CTS tool 102 may move to place another level of clock tree nodes 204 for clock tree 200. For example, a layer up in the clock tree hierarchy may now be placed. In moving to a new level of clock tree 200, clusters 502 that already have been formed may be used to form bigger clusters 506. For example, referring to FIG. 5, cluster 502-1 and 502-3 form cluster 506-1 and clusters 502-2 and 502-4 form cluster 506-2. Clock tree nodes 204-5 and 204-6 are placed in clusters 506-1 and 506-2, respectively. The same process may then be performed with the new clusters. For example, if 100,000 clusters were formed, these clusters may be clustered together to form 10,000 clusters. The same process for optimizing the clock skew may then be performed with these clusters.

Multiple clock tree nodes may be placed on the same level as clock tree node 204-4. The clock skew may then be measured from root node 202 to pins 206 through clock tree node 204-4. The above process of optimizing the skew across multiple different sets of clock tree timing variation parameters may also be performed. This process may continue until the entire clock tree is synthesized.

Figure 6:
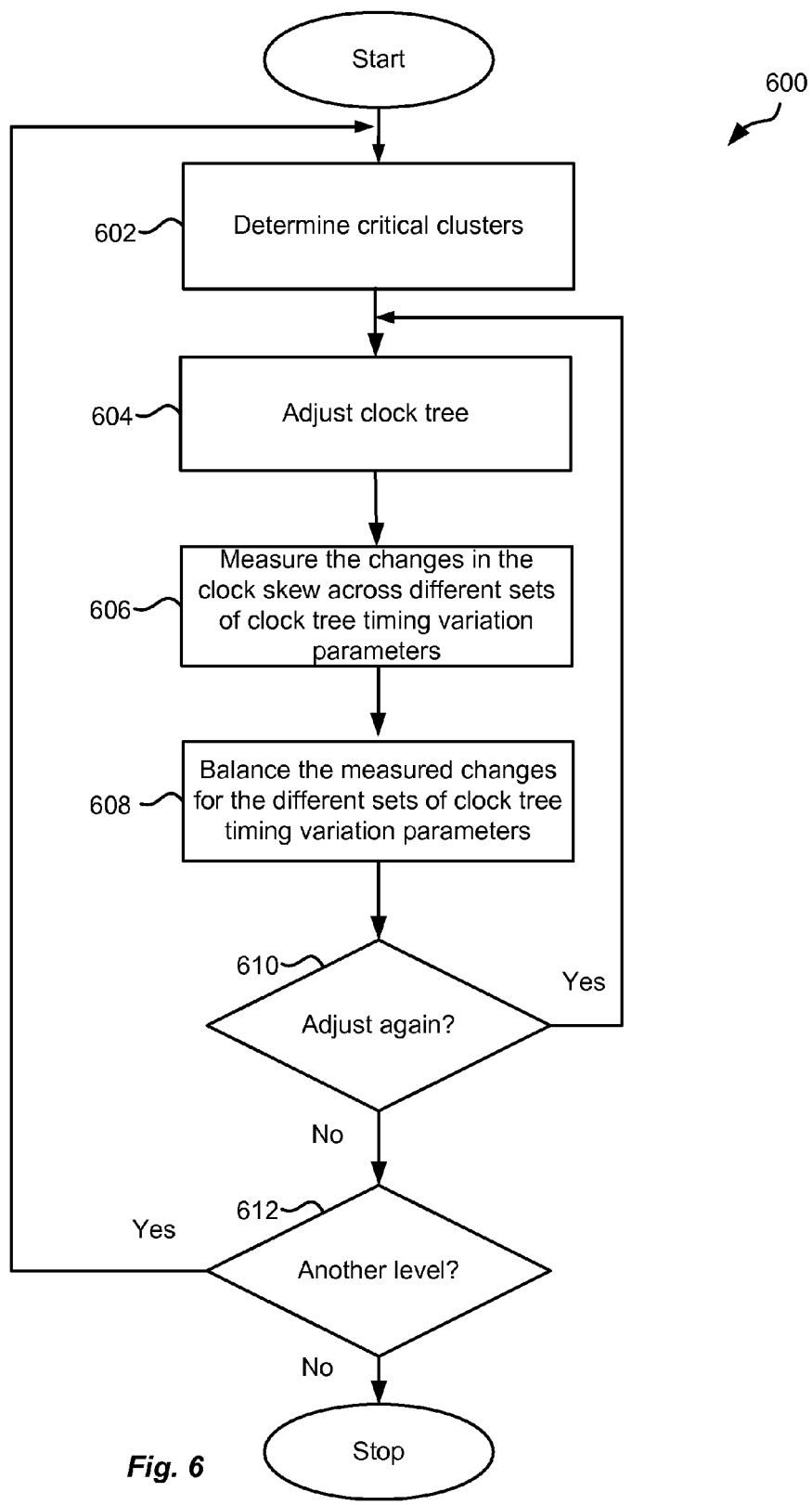
FIG. 6 depicts a simplified flowchart for optimizing the clock skew according to one embodiment.

The optimization of clock tree 200 will now be described in more detail. FIG. 6 depicts a simplified flowchart 600 for optimizing the clock skew according to one embodiment. In step 602, CTS tool 102 determines critical clusters 302. Critical clusters determine either the maximum delay or the minimum delay. These clusters may then be optimized because they may have the most effect on the timing of the design.

In step 604, CTS tool 102 adjusts clock tree 200. For example, cost metrics may be used to determine how to adjust clock tree 200. In one example, for the maximum delay cluster, the delay may depend on the clock tree node being used and the total load that the clock tree node is driving, such as the number of pins 206 being driven. If some pins are removed from cluster 302, the delay may be reduced. These pins may be pushed into another cluster or used to form a new cluster.

For the minimum delay, CTS tool 102 may increase the load on the clock-tree node (buffer) by either detaching some pins/nodes from some nearby node, and attaching it to this minimum delay node, or by changing the placement of this node to add more "interconnect"/wiring load seen by this node.

Also, the type of clock tree node may be changed to adjust the clock skew. For example, different types of clock tree nodes may provide different delays. Further, the position of the placement of the clock tree node may be changed. For example, by changing the clock tree node, the distance between pins 206 and clock tree node 204 adjusted and skew may be changed. Other changes may also be made to clock tree 200.

In step 606, CTS tool 102 measures the changes in the clock skew across different sets of clock tree timing variation parameters. For example, when clock tree 200 is adjusted, the skew may be affect timing in multiple process corners. For example, the clock skew may be improved in one corner, such as a maximum clock skew may be reduced. However, for conditions associated with a second corner, the clock skew may be increased, which may be an undesirable result. Accordingly, the change in clock skew is measured for multiple corners.

In step 608, CTS tool 102 balances the measured changes for the different sets of clock tree timing variation parameters. For example, if the adjustment provides a net positive in change for skew across multiple corners, then the change adjustment may be considered better. Step 610 determines if clock tree 200 should be adjusted again. For example, the process may be iterative and it may be determined that more improvements may be made. The prior adjustment may be discarded if the clock skew is considered worsened across multiple corners and/or modes or a further adjustment may be determined to the refine the prior adjustment. Accordingly, the process may reiterate to step 604.

If it is determined that clock tree 200 should not be adjusted again, in step 612, the process may move to another level of clock tree 200. The process may reiterate to step 602 where the process is repeated when clock tree nodes for the next level are placed.

Accordingly, CTS tool 102 uses different sets of clock tree timing parameters. Different sets of timing information can be determined and allows a balancing of the clock tree over the different sets of clock tree timing parameters. Thus, when one set of parameters is used, it can be determined how the change to a clock tree affects another set of parameters. This allows more efficient synthesis of the clock tree.

Having a tool that considered multi-corner or multi-mode information is useful because variation problems increase with different designs. For example, having mixed variation threshold (VT) threshold designs—Low VT and High VT cells may cause variations among corners. Also, temperature inversion problems due to the small geometries of the wires cause the worst case R values may now occur at low temperatures vs. high temperatures. Designs are becoming very complex physically with cores and macros now taking up over 40-50% of the physical area of a chip, which leads to physical differences in paths so the paths vary differently: a path through a standard cell area may vary differently vs. a path with very long wires going to Macros or in macro channels. These factors all cause variations that CTS tool 102 takes into account when synthesizing a clock tree.

Although the description has been described with respect to particular embodiments thereof, these particular embodiments are merely illustrative, and not restrictive. Although clock skew is discussed, other CTS metrics may be optimized.

Any suitable programming language can be used to implement the routines of particular embodiments including C, C++, Java, assembly language, etc. Different programming techniques can be employed such as procedural or object oriented. The routines can execute on a single processing device or multiple processors. Although the steps, operations, or computations may be presented in a specific order, this order may be changed in different particular embodiments. In some particular embodiments, multiple steps shown as sequential in this specification can be performed at the same time.

A "computer-readable medium" for purposes of particular embodiments may be any medium that can contain, store, communicate, propagate, or transport the program for use by or in connection with the instruction execution system, apparatus, system, or device. The computer readable medium can be, by way of example only but not by limitation, an electronic, magnetic, optical, electromagnetic, infrared, or semiconductor system, apparatus, system, device, propagation medium, or computer memory. Particular embodiments can be implemented in the form of control logic in software or hardware or a combination of both. The control logic, when executed by one or more processors, may be operable to perform that which is described in particular embodiments.

Particular embodiments may be implemented by using a programmed general purpose digital computer, by using application specific integrated circuits, programmable logic devices, field programmable gate arrays, optical, chemical, biological, quantum or nanoengineered systems, components and mechanisms may be used. In general, the functions of particular embodiments can be achieved by any means as is known in the art. Distributed, networked systems, components, and/or circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, a latitude of modification, various changes and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

We claim:

1. A method comprising:
   determining, by a computing device, one or more clusters of sink pins of circuit elements in a circuit design;
   placing, by the computing device, clock tree nodes of a clock tree for the circuit design within the one or more clusters;
   determining, by the computing device, multiple sets of clock tree timing variation parameters for the placed clock tree nodes within the one or more clusters;
   measuring, by the computing device, multiple delays from a root node of the clock tree to the sink pins within the one or more clusters, wherein the multiple delays are measured for the multiple sets of clock tree timing variation parameters, respectively;
   determining, by the computing device, skews for the one or more clusters using the delays measured for the multiple sets of clock tree timing variation parameters; and reducing, by the computing device, clock tree skew across the multiple sets of clock tree timing variation parameters using the multiple measured delays and skews.

2. The method of claim 1, wherein the multiple sets of clock tree timing parameters correspond to a plurality of process corners or a plurality of modes of operation, or a combination of at least one of the plurality of process corners and at least one of the plurality of modes of operation.

3. The method of claim 1, wherein the multiple sets of clock tree timing variation parameters comprise parameters that model two or more of the following operational modes in which the circuit design may operate: a test mode, a functional mode, or a stand-by mode.

4. The method of claim 1, wherein the reducing comprises:
modifying the one or more clusters;
measuring new delays from the root node of the clock tree to the sink pins within the modified one or more clusters, wherein the new delays are measured for the multiple sets of clock tree timing variation parameters, respectively;
determining new skews for the modified one or more clusters using the new delays measured for the multiple sets of clock tree timing variation parameters; and
determining whether the modifying of the one or more clusters improved the clock skew across the multiple sets of clock tree timing variation parameters, wherein the determining comprises comparing the skews for the one or more clusters with the new skews for the modified one or more clusters.

5. The method of claim 4, wherein the modifying the one or more clusters comprises:
moving one or more sink pins in a first cluster of the one or more cluster to a second cluster of the one or more clusters.

6. The method of claim 4, wherein the modifying the one or more clusters comprises:
moving one or more sink pins from at least one of the one or more clusters into a new cluster; and
including the new cluster in the modified one or more clusters.

7. The method of claim 1, wherein the reducing comprises:
determining at least one critical cluster of the one or more clusters, wherein a critical cluster determines a minimum or maximum delay of the measured multiple delays.

8. The method of claim 7, wherein:
the at least one critical cluster comprises a maximum delay cluster; and
the reducing further comprises reducing the maximum delay associated with the maximum delay cluster by moving one or more sink pins from the maximum delay cluster to another cluster of the one or more clusters.

9. The method of claim 7, wherein:
the at least one critical cluster comprises a minimum delay cluster; and
the reducing further comprises moving one or more sink pins to the minimum delay cluster from another cluster of the one or more clusters.

* * * * *